United States Patent [19]

Suski

[11] Patent Number: 5,616,050

[45] Date of Patent: Apr. 1, 1997

[54] FLEXIBLE CIRCUIT CONNECTOR

[75] Inventor: Edward D. Suski, Lake Forest, Calif.

[73] Assignee: AST Research Inc., Irvine, Calif.

[21] Appl. No.: 375,537

[22] Filed: Jan. 19, 1995

[51] Int. Cl.⁶ .................................................. H01R 23/66
[52] U.S. Cl. ................................. 439/495; 439/67
[58] Field of Search ............................. 439/492–499, 439/67, 77

[56] References Cited

U.S. PATENT DOCUMENTS

| 3,897,130 | 7/1975 | Donnelly et al. | 439/496 |
| 4,684,183 | 8/1987 | Kinoshita | 439/496 |
| 4,911,643 | 3/1990 | Perry | 439/493 |
| 5,040,997 | 8/1991 | Garner | 439/497 |
| 5,044,980 | 9/1991 | Krumme et al. | 439/496 |
| 5,195,897 | 3/1993 | Kent et al. | 439/493 |
| 5,383,788 | 1/1995 | Spencer | 439/493 |

OTHER PUBLICATIONS

Miraco Brochure—A New Frontier, Connector Density Down to 0.5 mm Pitch—Solving the Space Problem.

*Primary Examiner*—Neil Abrams
*Assistant Examiner*—Brian J. Biggi
*Attorney, Agent, or Firm*—Lyon & Lyon

[57] ABSTRACT

A flexible circuit connector is formed from a flexible printed circuit comprising a plurality of embedded electrically conductive lines partially exposed at a first end of the flexible printed circuit by bending or folding the flexible printed circuit to enable said first end to mate with a board mounted connector, thereby eliminating the need for a mating connector. When the flexible circuit connector is properly inserted into the board mounted connector, the mating of said plurality of exposed electrically conductive lines of said flexible circuit connector with a plurality of metal contacts on the board mounted connector provides an electrical interface between the flexible printed circuit and the board mounted circuit, as well as the boards on which the flexible printed circuit and board mounted connector are attached.

4 Claims, 4 Drawing Sheets

FLEXIBLE CIRCUIT CONNECTOR

FIELD OF THE INVENTION

This invention relates to electrical interfaces, and more specifically to a board-to-board connector formed from a flexible printed circuit, hereinafter referred to as a flexible circuit connector, wherein the flexible circuit connector is used in place of a mating connector for electrically interfacing a flexible printed circuit with a board mounted connector.

BACKGROUND OF THE INVENTION

A flexible printed circuit, or FPC as it is commonly referred to in the industry, is basically a strip or cable comprising a plurality of embedded electrically conductive lines. The flexible printed circuit is typically used for providing an electrical connection between electrical components on a first printed circuit board and electrical components on a second printed circuit board. Presently, there are two types of basic devices being used for providing an electrical interface between the flexible printed circuit and each of the printed circuit boards. These two types of connectors are typically referred to as a zero insertion force (ZIF) connector and a board-to-board connector.

First, mating the zero insertion force (ZIF) connector located on the printed circuit board with the flexible printed circuit having a plated, typically flat pad attached to a first end of the flexible printed circuit is well known in the art.

However, one of the drawbacks of using the zero insertion force connector is that, because of the standardized specification for the width of the connector pads, the density of lines obtainable within a predetermined amount of space is limited. With the continual miniaturization of certain electrical devices, such as portable computers, it is sometimes desirable to obtain a higher density of conductor lines than is available from using a zero insertion force connector between the flexible printed circuit and the printed circuit board. Furthermore, since some printed circuit boards are manufactured with different types of connectors, a zero insertion force connector may not be an available option.

Second, board-to-board connectors such as (1) a board mounted connector located on the printed circuit board, and (2) a mating connector attached to the first end of the flexible printed circuit, wherein the mating connector interfaces with the corresponding board mounted connector, is also well known in the art.

Although these mating connectors are designed to be reliably connected and disconnected through hundreds, and even thousands, of mating cycles, they are typically only connected and disconnected just a few times during manufacturing and maybe a few more times during a repair job. Therefore, one of the drawbacks of using the board mounted connector with the corresponding mating connector is the increased cost associated with paying for a level of durability that is not required for certain electrical interfaces.

Often times, the mating connectors are single sourced as matching proprietary parts by the same manufacturer that manufactures the corresponding board mounted connector. Therefore, with the absence of competition, the mating connectors sold and made available by the single source manufacturer are relatively more expensive than similar non-proprietary parts sold and made available by various competing manufacturers.

Furthermore, being tied to a single source manufacturer for the mating connectors increases the risk that the availability of these mating connector parts may be interrupted as a result of problems affecting the single source manufacturer. With a single source manufacturer producing these mating connector parts, there are no other manufacturers to serve as backup suppliers. This potential lack of availability could result in the delayed shipment of products that make use of the mating connectors.

In addition, since these mating connectors are typically soldered onto the flexible printed circuit, expensive heat resistant base materials are required for the design of the flexible printed circuit.

Therefore, a better solution is needed to provide an electrical interface between the flexible printed circuit and the printed circuit board, wherein the interface between the flexible printed circuit and the printed circuit board (1) accommodates a higher density of electrically conductive lines than the zero insertion force connector, (2) is readily available to meet demand with a lower risk of interruption in supplies, and (3) provides a cost savings over the board mounted connector-mating connector combination.

It is understood that the term "board mounted connector" is used herein as a clarifying term to describe a connector that happens to be mounted to the printed circuit board, as in a preferred embodiment described in greater detail below. The term "board mounted connector" however shall not be limited to connectors mounted to a board. For example, the board mounted connector may actually be connected to the printed circuit board via a second flexible printed circuit such that the board mounted connector and corresponding mating connector act as an interface between two flexible printed circuits which in turn connect two printed circuit boards, or electrical elements.

SUMMARY OF THE INVENTION

A board-to-board connector formed from a flexible printed circuit, or a flexible circuit connector, of the present invention provides for an electrical interface between the flexible printed circuit and a board mounted connector, thereby solving some of the problems that exist with the prior art zero insertion force connector and the prior art board mounted connector-mating connector combination.

The flexible circuit connector of the present invention is created by manufacturing the flexible printed circuit such that a plurality of embedded electrically conductive lines are partially exposed at a first end of the flexible printed circuit. Manufacturing flexible printed circuits in the manner described above, as well as various other designs and uses of flexible printed circuits, are well known in the art and is not discussed further herein. The first end of the flexible printed circuit is then formed to adapt to, or mate with, the board mounted connector without the use or need of the mating connector. In this manner, the resulting flexible circuit connector reduces or eliminates many of the problems or drawbacks associated with the prior art interfaces between the flexible printed circuit and the printed circuit board. Although described as being located at the first end, it is understood that the plurality of embedded electrically conductive lines can be partially exposed at any region along the length of the flexible printed circuit to satisfy the requirements of a particular flexible circuit connector design.

Some of the prior art problems mentioned above are reduced or eliminated because the flexible circuit connector, which is formed to mate with, or adapt to, the board mounted connector, (1) has a higher density than the zero insertion force connectors, and (2) does not require that the corresponding mating connectors be soldered to the flexible printed circuit thereby eliminating the need for high temperature tolerant materials. These benefits simplify the process, and reduce the cost, of manufacturing the flexible circuit connector of the present invention.

Furthermore, since the flexible circuit connector of the present invention utilizes the readily available material that forms the flexible printed circuit itself, the risk issue of the constant availability of mating connectors from a single source manufacturer is eliminated regardless of the manufacturer of the board mounted connector, since the flexible circuit connector of the present invention can be modified to fit most types of board mounted connectors.

Accordingly, it is an object of the present invention to provide an improved electrical interface.

It is a further object of the present invention to provide an improved board-to-board connector.

An additional object of the present invention is to provide a board-to-board connector formed from a flexible printed circuit, also referred to as a flexible circuit connector, for electrically interfacing a flexible printed circuit with a board mounted connector.

Further objects and advantages of the present invention will become apparent from a consideration of the drawings and ensuing description.

DETAILED DESCRIPTION

Figure 1:
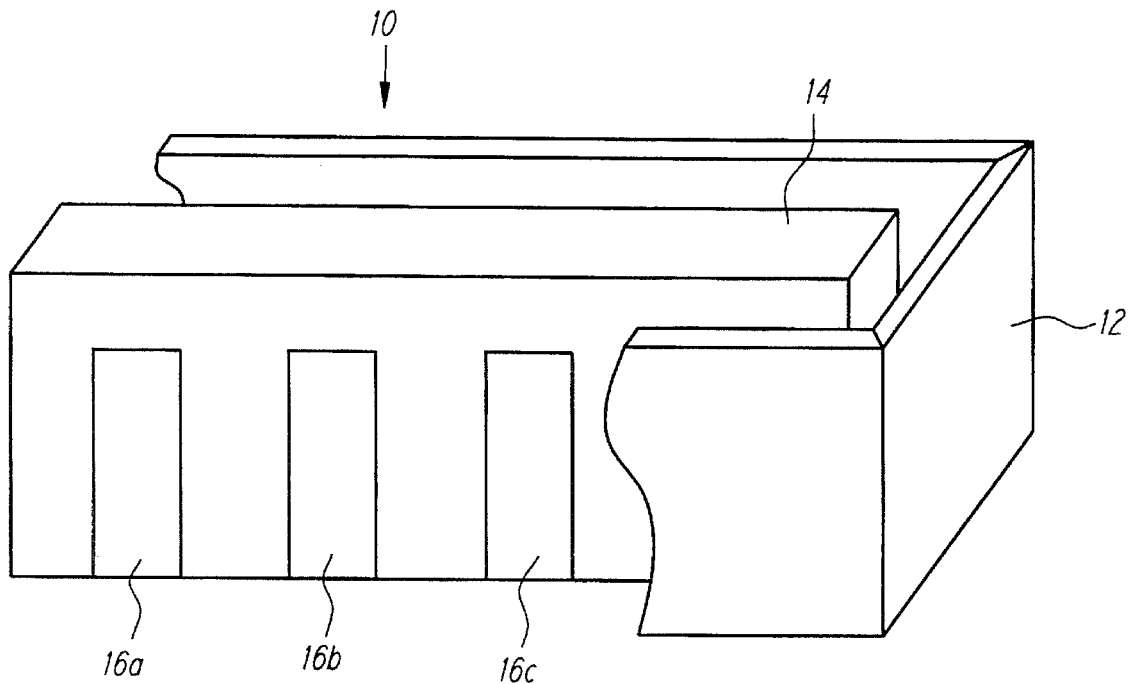
FIG. 1 a cutaway perspective view of a prior art board mounted connector. The board mounted connector in FIG. 1 is a plug, or male, type, connector.
Figure 3:
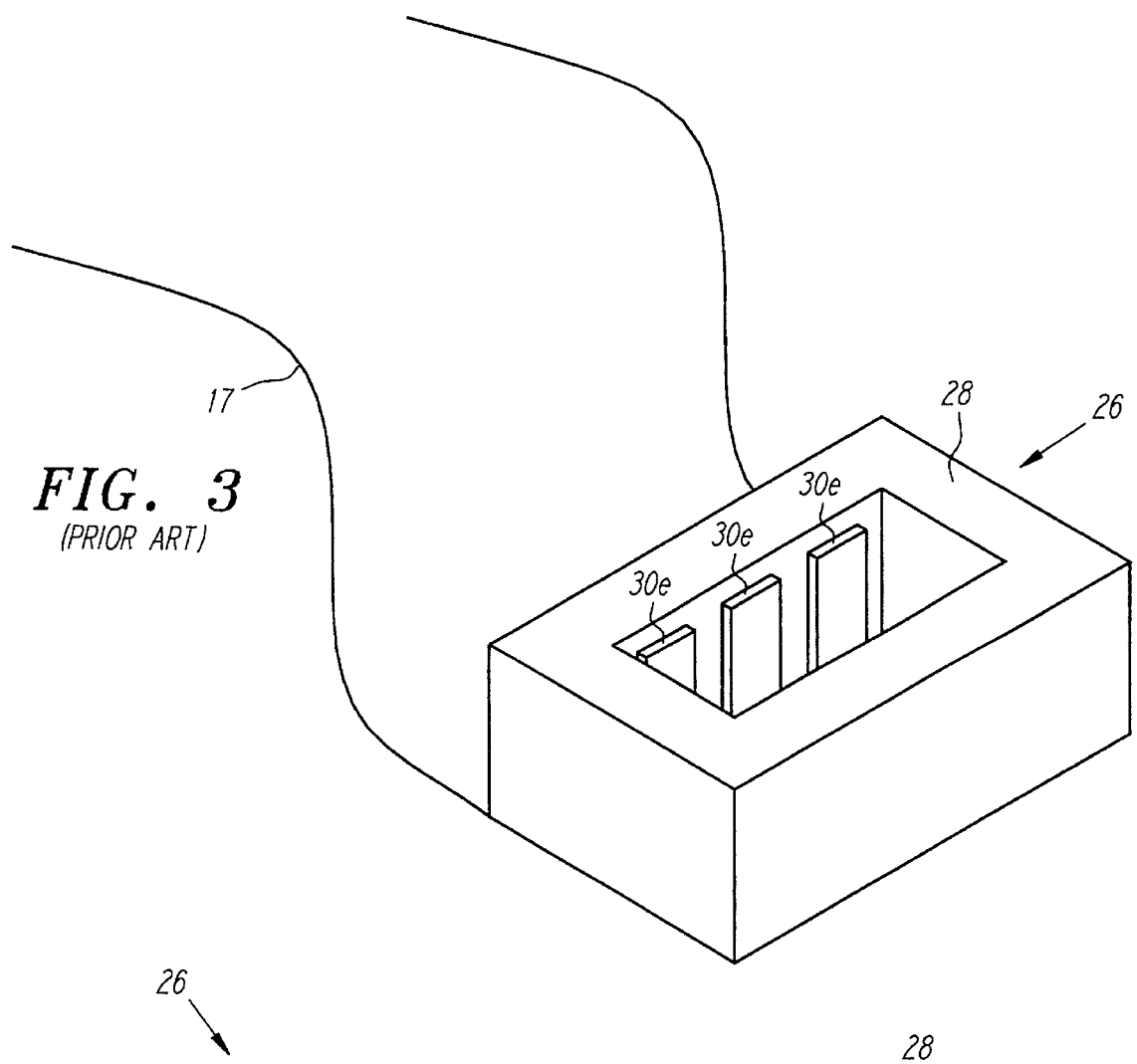
FIG. 3 is a perspective view of a prior art mating connector for attachment to a first end of a flexible printed circuit. The mating connector of FIG. 3 is a socket, or female type, connector.
Figure 5:
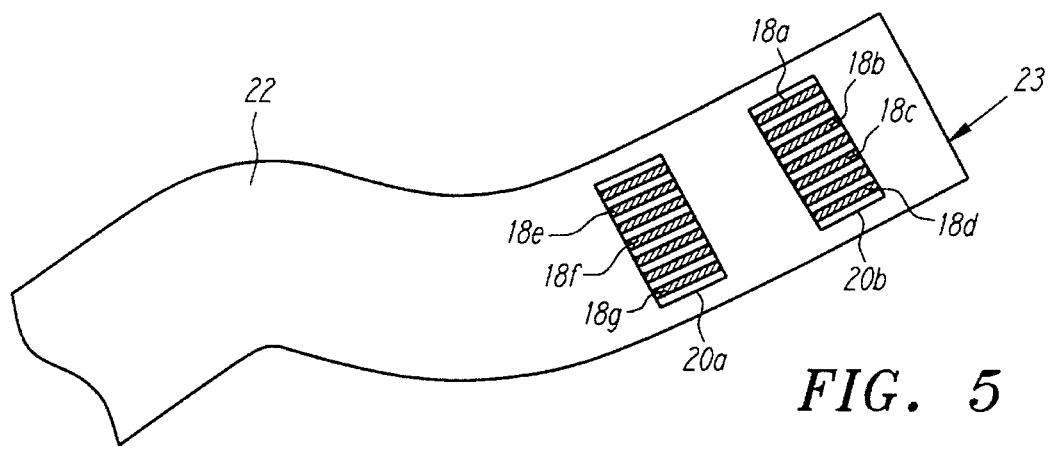
FIG. 5 is a perspective view of a flexible printed circuit with a plurality of embedded electrically conductive lines partially exposed at a first end of the flexible printed circuit.

Prior Art:

FIG. 1 is a cutaway perspective view of a board mounted connector 10. The board mounted connector 10 comprises a housing 12, a center guide 14, and a plurality of protruding first metal contacts 16 that provide for an electrical connection to elements on an underlying printed circuit board (not shown), or a flexible printed circuit 17 (as seen in FIG. 3 and generally as shown in FIG. 5), depending upon where the board mounted connector 10 is placed.

Figure 6:
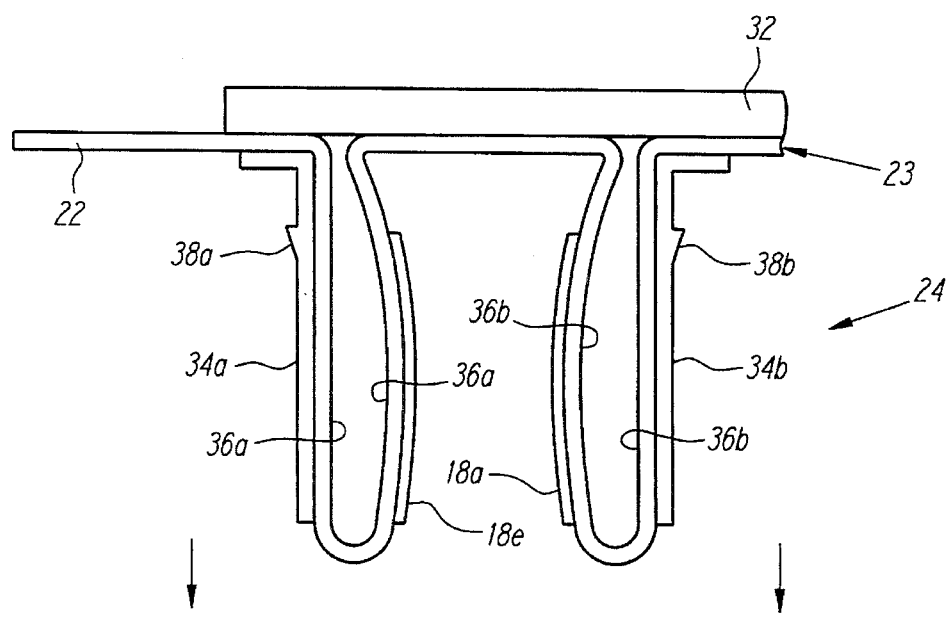
FIG. 6 is a side view of a female type board-to-board connector formed from the flexible printed circuit, also referred to as a flexible circuit connector. The flexible circuit connector is shown with stiffeners to assist in the insertion and removal of the flexible circuit connector from the board mounted connector.

It is to be understood that a connector and a connected, or male and female type connector, or plug and socket, are interchangeable. In other words, if the board mounted connector 10 is a male type connector or plug as shown, then a flexible circuit connector 24 (as shown in FIG. 6) of the present invention is correspondingly formed into a female type connector or socket, and vice versa. It does not matter whether the board mounted connector 10 on the printed circuit board (not shown) or flexible printed circuit 22 is a male or female type connector.

It is only important in that the flexible circuit connector 24 must correspondingly be formed into the opposite mating connector type.

Figure 2:
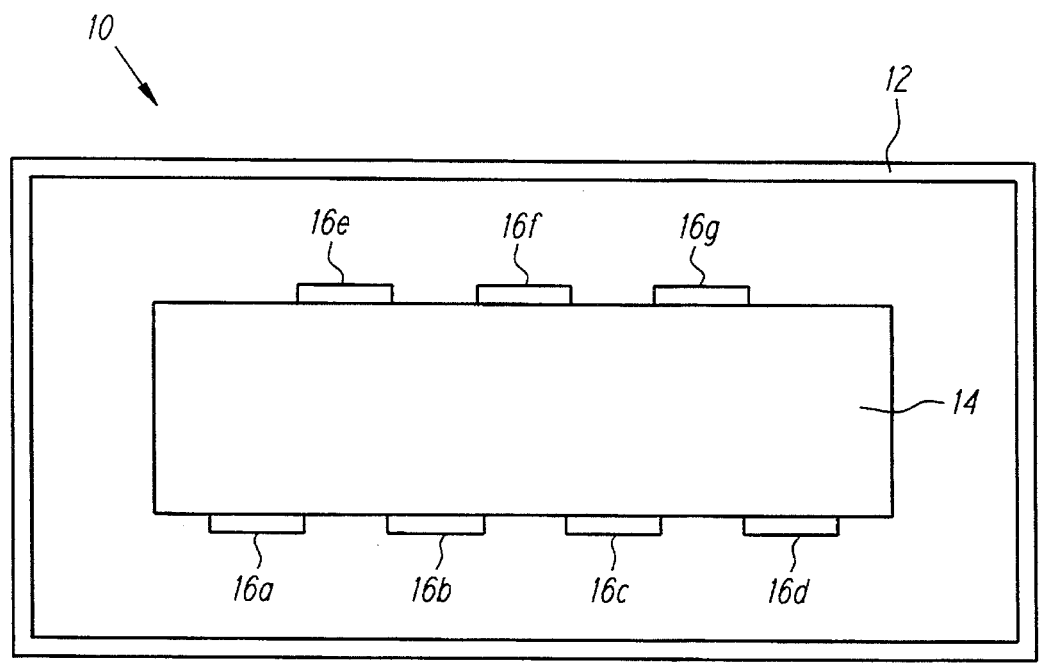
FIG. 2 is a top view of the prior art board mounted connector.

FIG. 2 shows a top view of the board mounted connector 10. The board mounted connector 10 in this illustration shows seven contacts 16a through 16g. It is to be understood that seven contacts are shown for illustrative purposes only, and that board mounted connectors typically have more than seven contacts, although it can have fewer than seven as well.

FIG. 3 shows a perspective view of a mating connector 26 for mating with the board mounted connector of FIG. 1. The mating connector 26 comprises a perimeter guide 28, and a plurality of protruding second metal contacts 30. The second metal contacts 30a through 30g (as better seen in FIG. 4) matingly correspond to the first metal contacts 16a through 16g, respectively, when the two connectors 10 and 26 are properly connected together, thereby creating an electrical interface.

Figure 4:
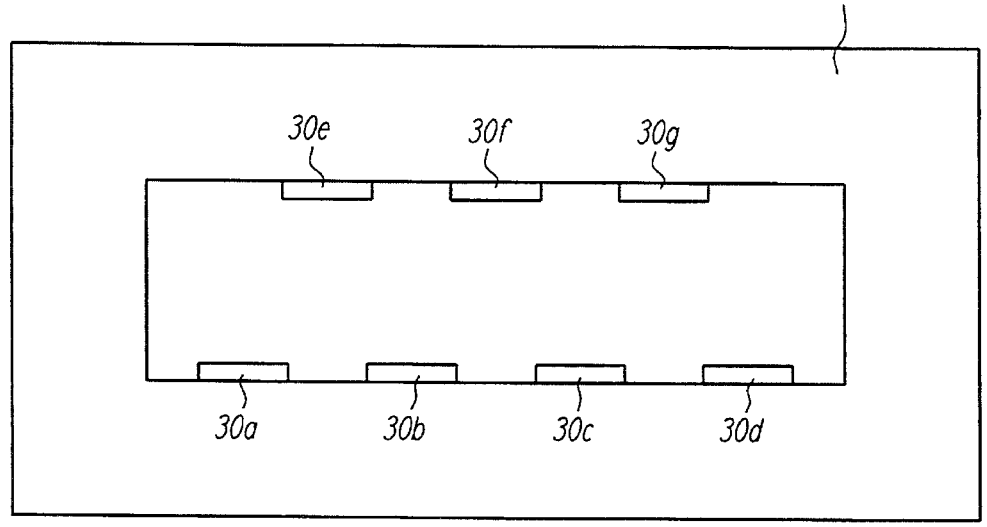
FIG. 4 is a top view of the prior art mating connector.

When properly mated, the perimeter guide 28 surrounds the center guide 14 of the board mounted connector 10 (FIG. 1 and 2), but is contained within the housing 12. When the mating connector 26, in this example a female type, is properly inserted into the corresponding board mounted connector 10, in this example a male type, an electrical interface is provided between the flexible printed circuit 17 to which the mating connector 26 is attached, and the printed circuit board to which the board mounted connector 10 is attached. FIG. 4 is a top view of the mating connector 26.

As discussed previously, the process of attaching the mating connector 26 to a first end 23 of the flexible printed circuit 17 requires that the mating connector 26 be soldered onto the flexible printed circuit 17 in order to provide an electrical connection between the electrically conductive lines (not shown) and the first metal contacts 16 of the board mounted connector 10 (FIG. 1). Therefore, the materials previously used in designing the flexible printed circuit 22 are, by necessity, high temperature tolerant materials that tend to be more expensive than non-high temperature tolerant materials. Furthermore, since the manufacturer of the board mounted connector 10 also typically manufactures the mating connector 26, and since the compatibility of these two components are usually proprietary, there is usually only a single source for the mating connectors 26. As mentioned earlier, this results in higher costs, as well as the additional risk that the availability of supplies may be interrupted since there are no backup suppliers in case of problems with the single source manufacturer.

Preferred Embodiment:

Turning now to a preferred embodiment of the present invention, FIG. 5 is a perspective view of a portion of a flexible printed circuit 22. In the preferred embodiment, the flexible printed circuit 22 comprises a plurality of embedded electrically conductive lines 18 that are partially exposed through a first aperture 20a and a second aperture 20b at the first end 23 of the flexible printed circuit 22. It is to be understood that the number of apertures designed into a given flexible printed circuit is a function of the number of apertures required to properly form a flexible circuit connector to adapt to a given board mounted connector.

FIG. 6 is a side view of the flexible circuit connector 24. The flexible circuit connector 24 is formed by bending or folding the flexible printed circuit 22 to provide exposed electrically conductive lines 18 which can act as replacements for the second metal contacts 30 of the mating connector 26 (FIG. 4). In this way, the need for the mating connector 26 is eliminated.

Figure 7:
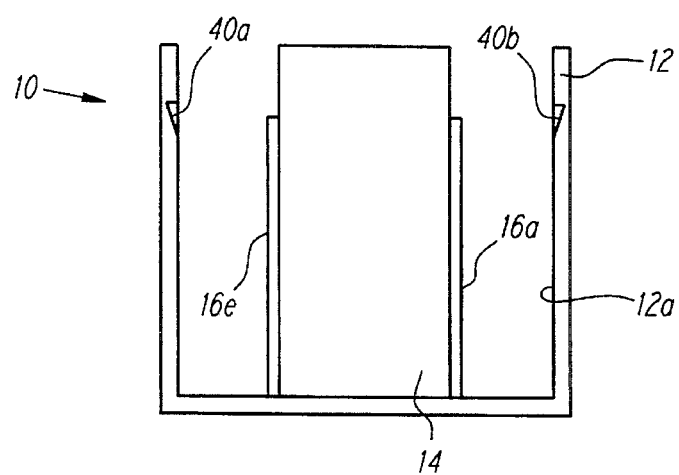
FIG. 7 is a cutaway side view of the board mounted connector. This view in conjunction with FIG. 6 illustrates how the flexible circuit connector should be inserted into the board mounted connector.

In the present example, where the flexible circuit connector 24 is a female type connector, the flexible circuit connector 24 is bent to form a first loop 36a and a second loop 36b, as shown in FIG. 6. It is to be understood that the loops 36 can be creased flat to form flat extensions from the flexible printed circuit 22, thereby acting as equivalents of the loops 36. A connector stiffener 32 is attached to the flexible printed circuit 22 such that the connector stiffener 32 is substantially parallel to the non-looped portion of the first end 23 of the flexible printed circuit 22. The connector stiffener 32 acts to retain the flexible printed circuit 22 in the shape required for the flexible circuit connector 24 to properly mate with the board mounted connector 10 as shown in FIG. 7.

In addition, a first insert stiffener 34a can be attached to an outer side of the first loop 36a opposite the first aperture 20a, and a second insert stiffener 34b can be attached to an outer side of the second loop 36b opposite the second aperture 20b, as shown in FIG. 6. The first and second insert stiffeners 34a and 34b act as support guides to ease the insertion and extraction of the flexible circuit connector 24 into and out of the board mounted connector 10 (FIG. 7).

Furthermore, the empty space that is created inside the first and second loops 36a and 36b can be filled with a compressible/expandable material, such as foam, so as to exert loop widening pressure on the electrically conductive lines 18, thereby ensuring a constant reliable contact between the electrically conductive lines 18 and the first metal contacts 16 of the board mounted connector 10.

Moreover, the first and second insert stiffeners 34a and 34b can each be designed to incorporate one or more abutments 38a and 38b that protrude away from the first and second loops 36a and 36b, respectively, as shown in FIG. 6. These abutments 38 work in conjunction with corresponding recesses 40a and 40b (FIG. 7) incorporated onto an inner portion 12a of the housing 12 such that the proper insertion of the flexible circuit connector 24 into the board mounted connector 10 causes the abutments 38 to click-lock into the corresponding recesses 40, thereby providing a secured interface. The operation and design of such a click-locking device is well known in the art, and is not discussed further.

The flexibility of the flexible printed circuit 22 is best appreciated when used in situations where a connection between two electrical elements or printed circuit boards require such flexibility. For example, when electrically connecting electrical elements or printed circuit boards located behind an active matrix TFT screen with electrical elements or printed circuit boards located underneath a keyboard, as is the case for the well known portable computer "notebook" configuration, it is important to have an electrical interface that can flex between the pivotally hinging screen and keyboard so that a constant reliable electrical connection can be maintained during the opening and closing of the pivoting screen.

Figure 8:
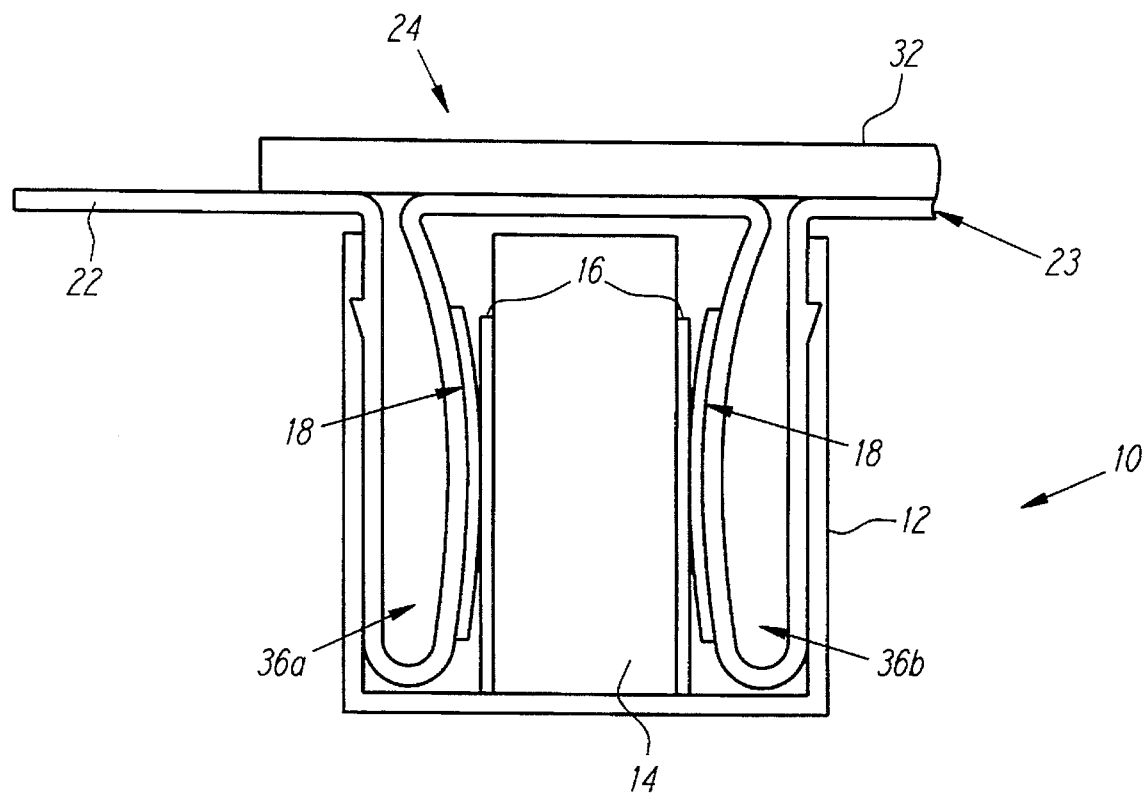
FIG. 8 is a cutaway side view of the flexible circuit connector shown properly inserted into the board mounted connector.

FIG. 8 is a simplified illustration showing the flexible circuit connector 24 properly inserted into the board mounted connector 10. For clarity, the flexible circuit connector 24 in this illustration is shown without the insert stiffeners 34 or the abutments 38, and the board mounted connector 10 is shown without the recesses 40.

Figure 9:
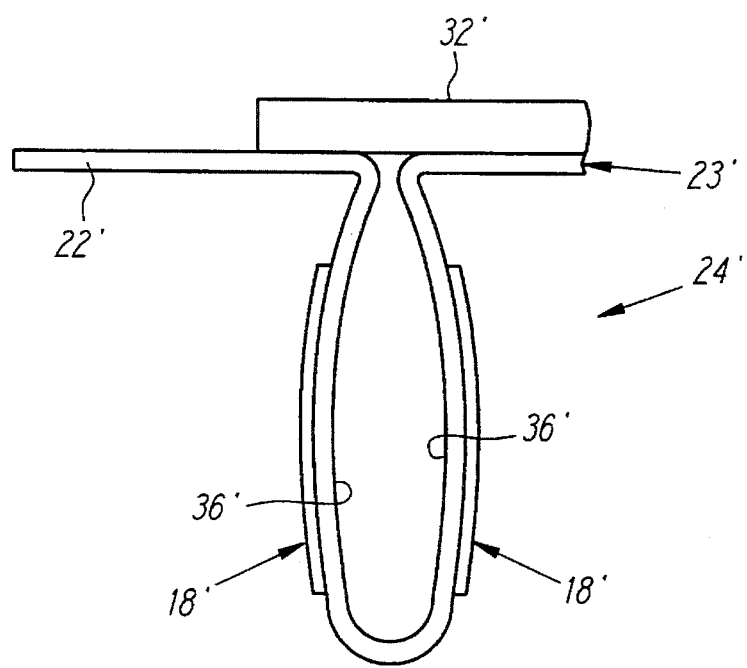
FIG. 9 is a side view of an alternative embodiment where only a single loop is required to form a male type flexible circuit connector or plug.

If a board mounted connector were of the female type (as similarly shown by the mating connector 26 of FIG. 3), then a person of ordinary skill can apply the teachings of the present invention to form a corresponding male type flexible circuit connector that is capable of matingly corresponding with the female type board mounted connector. FIG. 9 shows an alternative embodiment where only a single loop 36' is required to form a male type flexible circuit connector 24' comprising a flexible printed circuit 22', a connector stiffener 32', a first end 23', the loop 36', and electrically conductive lines 18'.

Furthermore, as stated previously, it is understood that "board mounted connector" is a term used only for convenience, and that the board mounted connector does not have to be physically mounted to a board.

In addition, the female type flexible circuit connector 24 (FIG. 6) of the present invention can be connected with the male type flexible circuit connector 24' (FIG. 9) to form an electrical interface, although such an interface is not commonly required. The most common requirement for a flexible circuit connector is when a manufacturer provides a printed circuit board with a board mounted connector, and then sells a corresponding mating connector for a relatively high price. It is in this situation that the present invention presently offers its greatest benefits.

Finally, a person of ordinary skill in the art will understand that the flexible circuit connector 24 of the present invention is not limited to a single layered, non-high temperature tolerant flexible printed circuit. A person of ordinary skill in the art can apply the teachings of the present invention equally well to various flexible printed circuit compositions known in the art, as well as to flexible printed circuits comprising multiple layers of conductive lines, or high temperature tolerant materials.

While the above description contains many specificities, these should not be construed as limitations on the scope of the invention, but rather as an exemplification of preferred embodiments thereof. Many other variations are possible.

What is claimed is:

1. A flexible circuit connector comprising a flexible printed circuit comprising a plurality of embedded electrically conductive lines, at least one aperture on a region of said flexible printed circuit partially exposing at least some of said plurality of embedded electrically conductive lines, said region of said flexible printed circuit being formed into at least one loop to allow said partially exposed plurality of embedded electrically conductive lines to function as contacts of a mating connector to mate with corresponding contacts on a board mounted connector when said flexible circuit connector is inserted into the board mounted connector, at least one insert stiffener attached to an outer side of said loop opposite said aperture, thereby acting as a support guide to ease the insertion and extraction of said flexible circuit connector into and out of the board mounted connector, and at least one abutment protruding from said insert stiffener to enable said abutment to click into a recess formed on an inner edge of a housing for the board mounted connector, thereby providing for a secure interface when said flexible circuit connector is properly inserted into the board mounted connector.

2. A flexible circuit connector comprising a flexible printed circuit comprising a plurality of embedded electrically conductive lines, at least one aperture on a region said flexible printed circuit partially exposing at least some of said plurality of embedded electrically conductive lines, said region of said flexible printed circuit being formed into at least one loop to allow said partially exposed plurality of embedded electrically conductive lines to function as contacts of a mating connector to mate with corresponding contacts on a board mounted connector when said flexible circuit connector is inserted into the board mounted connector, said electrically conductive lines being thicker where partially exposed than where embedded within said flexible printed circuit, a connector stiffener attached to said region of said flexible printed circuit and substantially parallel to a nonlooped portion of said region, thereby acting to retain said flexible printed circuit in a shape required for said flexible circuit connector to properly mate with the board mounted connector, at least one insert stiffener attached to an outer side of said loop opposite said aperture, thereby acting as a support guide to ease the insertion and extraction of said flexible circuit connector into and out of the board mounted connector, said insert stiffener further comprising at least one abutment protruding from said insert stiffener to enable said abutment to click into a recess formed on an inner edge of a housing for the board mounted connector, thereby providing for a secure interface when said flexible circuit connector is properly inserted into the board mounted connector, and said loop having therein a compressible material to allow said compressible material to provide an outward force on said loop when said flexible circuit connector is properly inserted into the board mounted connector, thereby ensuring a constant and reliable contact between said partially exposed electrically conductive lines and the contacts of the board mounted connector.

3. A method of producing a flexible circuit connector comprising the following steps:

manufacturing a flexible printed circuit comprising a plurality of embedded electrically conductive lines, incorporating at least one aperture on a region of said flexible printed circuit to partially expose at least some of said plurality of embedded electrically conductive lines, forming said region of said flexible printed circuit into at least one loop to enable said partially exposed plurality of embedded electrically conductive lines to function as contacts of a mating connector to mate with corresponding contacts on a board mounted connector when said flexible circuit connector is properly inserted into the board mounted connector, attaching at least one insert stiffener to an outer side of said loop opposite said aperture, thereby acting as a support guide to ease the insertion and extraction of said flexible circuit connector into and out of the board mounted connector, and incorporating at least one abutment protruding from said insert stiffener to enable said abutment to click into a recess formed on an inner edge of a housing for the board mounted connector, there by providing for a secure interface when said flexible circuit connector is properly inserted into the board mounted connector.

4. A flexible circuit connector comprising a flexible printed circuit comprising a plurality of embedded electrically conductive lines, at least one aperture on a region of said flexible printed circuit partially exposing at least some of said plurality of embedded electrically conductive lines, said region of said flexible printed circuit being formed into at least one loop, at least one insert stiffener attached to an outer side of said loop opposite said aperture, and at least one abutment protruding from said insert stiffener.

* * * * *